(12) United States Patent
Schmid et al.

(10) Patent No.: US 8,513,702 B2
(45) Date of Patent: Aug. 20, 2013

(54) USE OF A METAL COMPLEX AS A P-DOPANT FOR AN ORGANIC SEMICONDUCTIVE MATRIX MATERIAL, ORGANIC SEMICONDUCTOR MATERIAL AND ORGANIC LIGHT-EMITTING DIODES

(75) Inventors: Günter Schmid, Hemhofen (DE); Ralf Krause, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 10 days.

(21) Appl. No.: 12/665,934

(22) PCT Filed: Jun. 18, 2008

(86) PCT No.: PCT/DE2008/001033
§ 371 (c)(1),
(2), (4) Date: Jun. 7, 2010

(87) PCT Pub. No.: WO2008/154914
PCT Pub. Date: Dec. 24, 2008

(65) Prior Publication Data
US 2010/0308306 A1 Dec. 9, 2010

(30) Foreign Application Priority Data
Jun. 20, 2007 (DE) .......................... 10-2007-028-238

(51) Int. Cl.
*H01L 21/00* (2006.01)
*H01L 21/84* (2006.01)

(52) U.S. Cl.
USPC .... 257/157; 438/198; 257/255; 257/E21.409; 257/E29.255

(58) Field of Classification Search
USPC .......... 257/255, E21.409, E29.255; 438/157, 438/198
See application file for complete search history.

(56) References Cited

U.S. PATENT DOCUMENTS

| | | | |
|---|---|---|---|
| 7,061,009 B2* | 6/2006 | Nelles et al. | 257/40 |
| 7,485,375 B2 | 2/2009 | Tokuda et al. | |
| 7,972,541 B2* | 7/2011 | Werner et al. | 252/519.2 |
| 2004/0241492 A1 | 12/2004 | Tokuda et al. | |
| 2007/0043188 A1* | 2/2007 | Schaubroeck et al. | 526/283 |
| 2007/0075311 A1* | 4/2007 | Okada | 257/40 |
| 2007/0114919 A1* | 5/2007 | Sotoyama | 313/504 |
| 2007/0132373 A1* | 6/2007 | Kinoshita et al. | 313/504 |
| 2007/0172700 A1* | 7/2007 | Nishita | 428/690 |

(Continued)

FOREIGN PATENT DOCUMENTS

| | | |
|---|---|---|
| CN | 1826840 | 8/2006 |
| EP | 1 289 030 | 3/2003 |

(Continued)

OTHER PUBLICATIONS

Cotton et al. "Closed Shell Molecules that Ionize More Readily than Cesium", Science vol. 298, 1971-1974 (2002).

(Continued)

*Primary Examiner* — Telly Green
(74) *Attorney, Agent, or Firm* — Cozen O'Connor

(57) ABSTRACT

A metal complex is used as p-dopant for an organic semiconducting matrix material, to an organic semiconductor material and to an organic light-emitting diode. Also disclosed is the use of metal complexes, which function as Lewis acids, as p-dopants in organic matrix materials.

16 Claims, 7 Drawing Sheets

(56) References Cited

U.S. PATENT DOCUMENTS

| | | | |
|---|---|---|---|
| 2007/0181876 A1* | 8/2007 | Itai | 257/40 |
| 2007/0185343 A1* | 8/2007 | Verpoort et al. | 556/30 |
| 2007/0205411 A1* | 9/2007 | Itai | 257/40 |
| 2007/0278479 A1* | 12/2007 | Werner et al. | 257/40 |
| 2008/0026933 A1* | 1/2008 | Pugin et al. | 502/102 |
| 2008/0093988 A1* | 4/2008 | Tobise et al. | 313/504 |
| 2008/0166636 A1* | 7/2008 | Niitani et al. | 429/317 |
| 2008/0187748 A1* | 8/2008 | Mishima | 428/336 |
| 2008/0191618 A1* | 8/2008 | Mishima | 313/504 |
| 2008/0293905 A9* | 11/2008 | Schaubroeck et al. | 526/283 |

FOREIGN PATENT DOCUMENTS

| | | |
|---|---|---|
| EP | 1 860 709 | 11/2007 |
| JP | 03 208689 | 9/1991 |
| JP | 2010-510179 | 4/2010 |
| JP | 2010-510645 | 4/2010 |
| JP | 2010-512663 | 4/2010 |
| TW | 200421220 | 12/2002 |
| WO | WO 2005/036667 | 4/2005 |
| WO | WO 2005/086251 | 9/2005 |
| WO | WO 2008/061517 | 5/2008 |
| WO | WO 2008/061518 | 5/2008 |
| WO | WO 2008/073409 | 6/2008 |
| WO | WO 2008/155310 | 12/2008 |

OTHER PUBLICATIONS

K. Yamashita et al., "Fabrication of an Organic P-N. Homojunction Diode Using Electrochemically Cation-and Photochemically Anion-Doped Polymer", Japanese Journal of Applied Physics, vol. 34, No. 7B, pp. 3794-3797, Jul. 1, 1995.

F.A. Cotton, et al., "Polyhedron", vol. 19, pp. 1829-1835, 2000.

* cited by examiner

- 150 nm NBP
- 150 nm NBP:PDW2 [1%]
- 150 nm NBP:PDW2 [5%]
- 150 nm NBP:PDW2 [10%]

---- 150 nm NBP
—— 150 nm NBP:PDW2 [1%]
—— 150 nm NBP:PDW2 [5%]
—— 150 nm NBP:PDW2 [10%]
—— 70 nm pure PDW2

- 150 nm NBP
- 150 nm NBP:PDW2 [10%]
- 150 nm NBP:Re$_2$O$_7$ [10%]
- 150 nm NBP:F$_4$TCNQ [10%]
- 150 nm NBP:MoO$_3$ [10%]

$\mu = 0.786 \cdot \dfrac{d^2}{t_{trans} \cdot [V - V_{bi}]}$ $\sigma = n \cdot e \cdot \mu$

- ● — 150 nm Naphdata
- ○ — 150 nm Naphdata: P DW2 [10%]

USE OF A METAL COMPLEX AS A P-DOPANT FOR AN ORGANIC SEMICONDUCTIVE MATRIX MATERIAL, ORGANIC SEMICONDUCTOR MATERIAL AND ORGANIC LIGHT-EMITTING DIODES

RELATED APPLICATIONS

This is a U.S. national stage of application No. PCT/DE2008/001033, filed on Jun. 18, 2008.

This application claims the priority of German application no. 10 2007 028 238.0 filed Jun. 20, 2007, the entire content of which is hereby incorporated by reference.

Use of a metal complex as p-dopant for an organic semiconducting matrix material, organic semiconductor material and organic light-emitting diode The invention relates to the use of a metal complex as p-dopant for an organic semiconducting matrix material, to an organic semiconductor material and to an organic light-emitting diode.

BACKGROUND OF THE INVENTION

Doping organic semiconducting materials with electron acceptors to increase conductivity in organic matrix materials is known from WO 2005/086251 for example. Metal complexes, in particular polynuclear metal complexes such as "paddle-wheel" complexes, are described as n-dopants for electron injection due to their strong donor properties.

However, there is a need to provide p-dopants for doping the hole injection layer.

SUMMARY OF THE INVENTION

One object of the present invention is to provide p-dopants for a hole-conducting matrix and to disclose the uses of such doped hole-conducting matrix materials in a radiation-emitting device, in particular an organic light-emitting diode (OLED).

This object is achieved in accordance with one aspect of the present invention by the use of neutral metal complexes of a Lewis acid nature as p-dopants in hole-conducting organic matrix materials. In addition, this object is achieved in accordance with another object of the present invention directed to an organic semiconducting material with a compound of such a metal complex of a Lewis acid nature as p-dopant. Finally, the object is also achieved by the provision of OLEDs with at least one layer of an organic matrix material according to the invention.

An embodiment of the present invention provides the use of a neutral metal complex with Lewis acid properties as p-dopant for an organic semiconducting matrix material. Another embodiment of the invention provides a hole conductor layer consisting of a hole-conducting organic matrix material with a proportion of 0.1 to 50 (% layer thickness) of metal complex as p-dopant. Another embodiment of the invention provides an OLED, comprising at least one layer of a doped hole conductor material, which contains a metal complex as p-dopant.

Lewis acids are compounds which act as electron pair acceptors. A Lewis base is accordingly an electron pair donor, which may donate electron pairs. In particular, the Lewis acid property of the metal complexes should be related to the hole-conducting organic matrix material, which then constitutes (or contains) the corresponding Lewis base.

A metal complex is a compound in which a metal atom or metal ion is coordinated by one or more ligands. As a rule the metal complex is an organometallic compound, i.e. a complex, in which at least part of the ligand contains carbon and often also a hydrocarbon.

Advantageously the metal complex comprises a polynuclear complex, in particular a complex with at least one metal-metal bond.

According to an advantageous embodiment, at least one central atom of the metal complex is selected from the platinum group metals, comprising the following elements: ruthenium, rhodium, palladium, osmium, iridium and platinum. In particular, rhodium complexes are preferred.

According to an advantageous embodiment the central atom is a neutral or charged, in particular positively charged, transition metal atom.

DETAILED DESCRIPTION OF THE DRAWINGS

Hole conductors are understood to be the typical materials which act in hole-conductive manner in the OLED, such as NPB (N,N'-di-1-naphthyl-diphenylbenzidine, HOMO=5.5 eV; LUMO=2.4 eV) or NaphDATA (4,4',4"-tris(N-(1-naphthyl)-N-phenyl-amino)-triphenylamine; HOMO=5.1 eV; LUMO=2.3 eV).

Doping is indicated hereinafter in relative layer thicknesses, i.e. x % means that the deposition rate of the dopants amounts to x % relative to the deposition rate of the matrix.

Advantageously the neutral metal complex takes the form of a complex with a "paddle-wheel" structure, bi- and polynuclear metal complexes with at least one metal-metal bond particularly preferably being used, as known for example from "Cotton F A, Gruhn N E, Gu J, Huang P, Lichtenberger D L, Murillo C A, Van Dorn L O and Wilkinson C C: "Closed Shell Molecules That Ionize More Readily Than Cesium" in Science, 2002, 298: 1971-1974. These structures are also described in WO 2005/086251, in which it is assumed, however, that polynuclear metal complexes with a "paddle-wheel" structure act as n-dopants. This is not true, however, of all paddle-wheel complexes or the structures mentioned therein, as has proved possible to demonstrate here.

Figure 1:
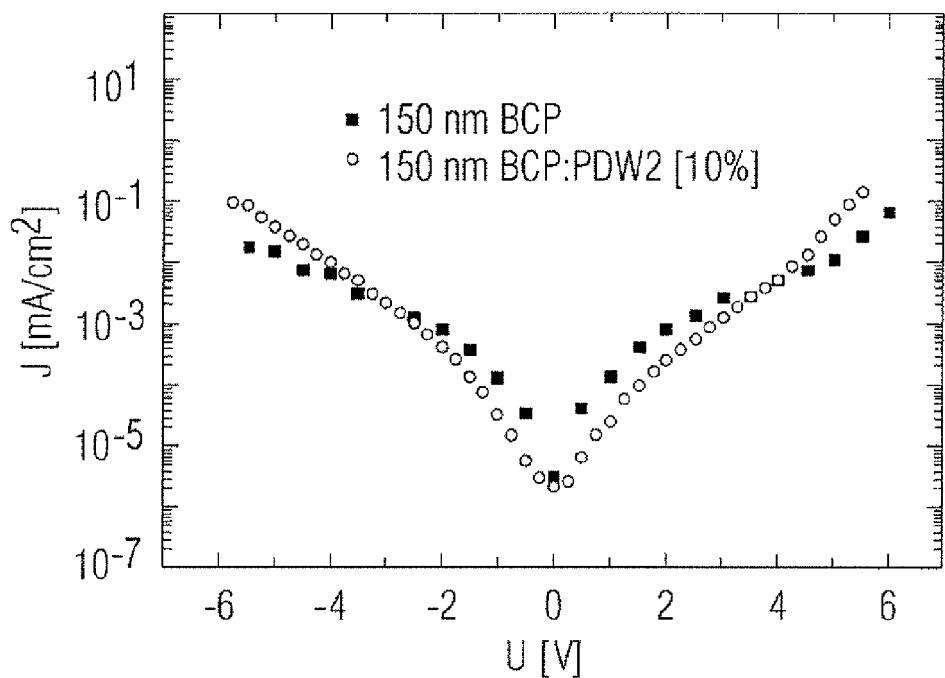
FIG. 1 shows characteristic curves obtained by doping BCP.

WO 2005/086251 A2 presents complexes with a paddle wheel structure as typical n-dopants. To check whether dirhodium tetratrifluoroacetate (PDW-2), a typical representative of metal complexes of a strongly Lewis acid nature, as are to be protected here as p-dopants, can be used as an n-dopant, the following experiment was carried out:

A 150 nm thick layer of the electron conductor BCP (=2, 9-dimethyl-4,7-diphenyl-1,10-phenanthroline) was deposited on an ITO (indium-tin oxide=indium-doped tin oxide) electrode by thermal vapour deposition. The counter electrode took the form of a 150 nm thick aluminium layer. FIG. 1 shows the result, a 4 mm$^2$ component being measured which gave rise to the typical characteristic curve identified by squares (FIG. 1 squares).

In a second experiment 10% PDW-2 was doped into the BCP layer by vapour co-deposition. The characteristic curve identified by circles in FIG. 1 differs only insignificantly from the characteristic curve of the pure BCP. PDW-2 cannot therefore generally be used as an n-dopant, in particular not in an OLED and the typical electron conductors used therein with a typical HOMO in the range from 5.8-6.2 eV or a typical LUMO in the range from 3.0-2.4 eV.

Figure 2:
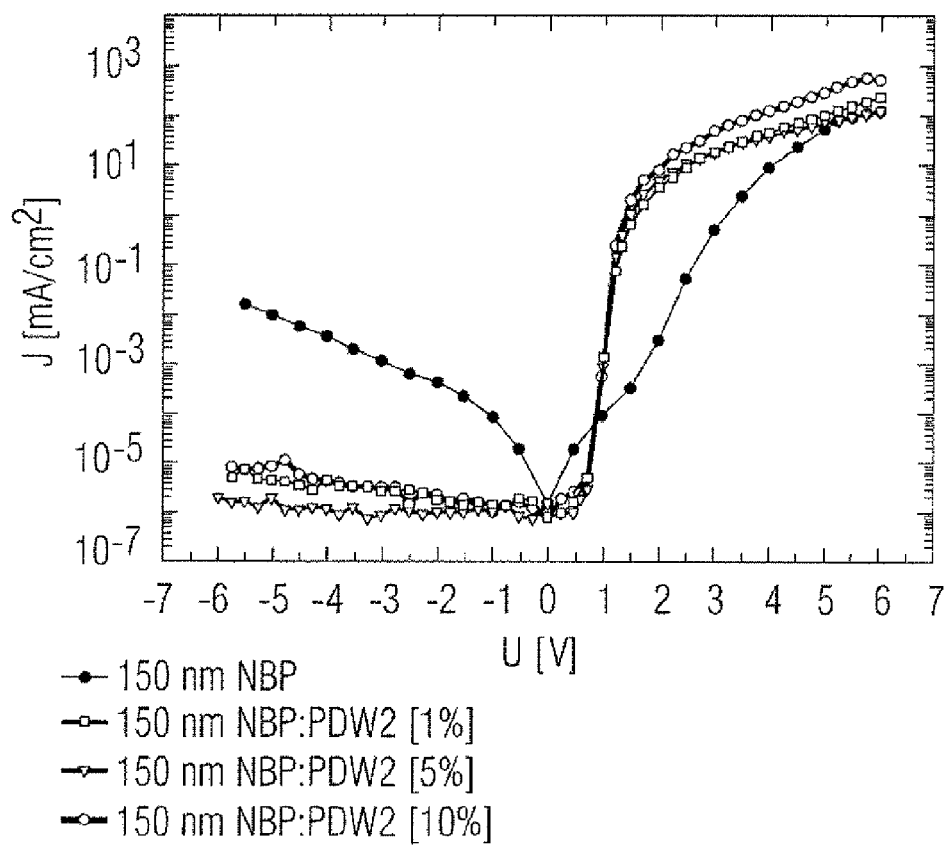
FIG. 2 shows characteristic curves obtained by doping NBP.

As in the above-described experiment, PDW-2 is doped into the hole conductor NPB (=bis-N,N,N',N'-(naphthyl-phenyl)benzidine) by vapour co-deposition. The characteristic curves shown in FIG. 2 were obtained for 0% doping (solid circles), 1% doping (squares), 5% doping (triangles) and 10% doping (blank circles).

These clearly demonstrate the possibility of p-doping hole-conducting matrix materials with PDW-2. Surprisingly, no holes can be injected from aluminium (negative branch of the x axis), so resulting in a rectification factor of $3.10^{-7}$. Just a few percent relative layer thicknesses (in particular 0-50%, particularly preferably O-15%) are sufficient for effective doping. The characteristic curves between 1-10% PDW-2 in NPB are virtually identical. The characteristic curves are additionally very steep. At higher voltages the characteristic curve saturates, so resulting in current-limiting behaviour.

The doping of organic matrix materials with p-dopants is of crucial relevance for organic light-emitting diodes. Luminescence (cd/m$^2$), efficiency (cd/A) and service life (h) of organic light-emitting diodes are heavily dependent on the exciton density in the light-emitting layer and the quality of charge carrier injection and are inter alia also limited thereby. Doped transport layers have the advantage that only a fraction of the voltage needed for operation (<<30%) drops off there relative to the overall structure. Particularly preferably, the drop in voltage is less even by a power of ten or more, such that no voltage drop is observed at the transport layers.

Figure 3:
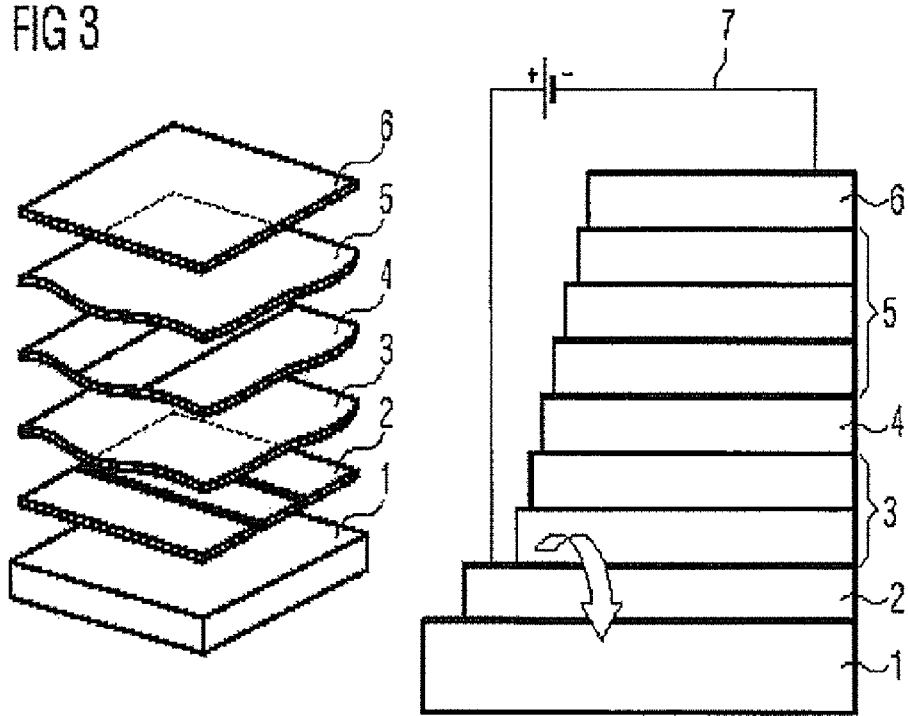
FIG. 3 shows the structure of an OLED with individual functional layers.

FIG. 3 shows the structure of an OLED with individual functional layers. Visible therein is the bottom and at the same time thickest layer 1, which constitutes the substrate, for example of quartz, glass or a metal foil or polymer film. On top of this is the transparent electrode 2, for example an electrode of a transparent conductive oxide. Transparent conductive oxides ("TCO" for short) are transparent, conductive materials, generally metal oxides, such as for example zinc oxide, tin oxide, cadmium oxide, titanium oxide, indium oxide or indium tin oxide (ITO). In addition to binary metal-oxygen compounds, such as for example $ZnO$, $SnO_2$ or $In_2O_3$, ternary metal-oxygen compounds, such as for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, TCOs do not necessarily correspond to a stoichiometric composition and may be also p- or n-doped.

In the case of top-emitting diodes the electrode (2) may be a (non-transparent) layer of metals. The substrate may then be a non-transparent metal foil, for example. FIG. 3 shows an ITO anode, for example. On this lower electrode is located the hole conductor layer 3, which is formed according to the invention from an organic matrix material, which is doped with a metal complex, which represents a Lewis acid.

The actually active layer of the OLED, the emitting layer 4, is located on the hole conductor layer 3. On top of that are the electron transport layer 5 and the counter-electrode 6. The emitting layer 4 may for example be an organic functional layer, based for example on polymers such as poly(p-phenylene-vinylene) (PPV) or on low molecular weight "small molecules", such as for example tris(8-hydroxyquinolato)-aluminium (Alq). It may additionally for example comprise phosphorescent triplet emitters such as tri(phenylpyridino)-iridium (III), doped into a matrix material bis-N,N'-carbazolylbiphenyl (CPB). The emitter layer may also consist of a number of individual emitter layers, red, green or blue light being emitted for example. In addition to the layers 1 to 6 shown, it is also convenient to protect the OLED by encapsulation.

The electrodes are connected to the voltage source by way of the electrical lead 7.

Homogeneity of charge injection plays an important part in the case of large-area luminescent elements. Particles, crystallites or spikes cause field overshoots and thus potential starting points for "dark spots", which may lead to failure of the luminescent element. A hole injection layer, into which binuclear rhodium acetate-based "paddle-wheel" complexes have been embedded, may be used to produce a layer which displays unexpectedly high current carrying capacity in conjunction with inherent current limiting.

Rhodium complexes are preferably used, such as metal complex compounds with an $Rh_2^{4+}$ nucleus and a metal-metal bond, which act as p-dopant and electron acceptor due to their significant Lewis acid nature.

Dirhodium tetratrifluoroacetate (FIG. 4) is particular preferred, it being very highly suitable due to its favourable sublimation characteristics. In the chemical literature [F. A. Cotton, C. A. Murillo, R. A. Walton "Multiple Bonds between Metal Atoms" 3rd edition, Springer Science and Business Media, Inc. 2005.465-611.] it has also unexpectedly proved possible to demonstrate that even unsubstituted aromatics may serve as donors for the $Rh_2^{4+}$ nucleus in the axial position. It has also proved possible experimentally, by doping NPB or NaphDATA (NaphDATA-4,4',4"-tris((N-naphthyl)-N-phenyl-amino)-triphenylamine) with PDW-2 in the above-described experiments, to demonstrate that this process brings about p-doping.

Figure 4:
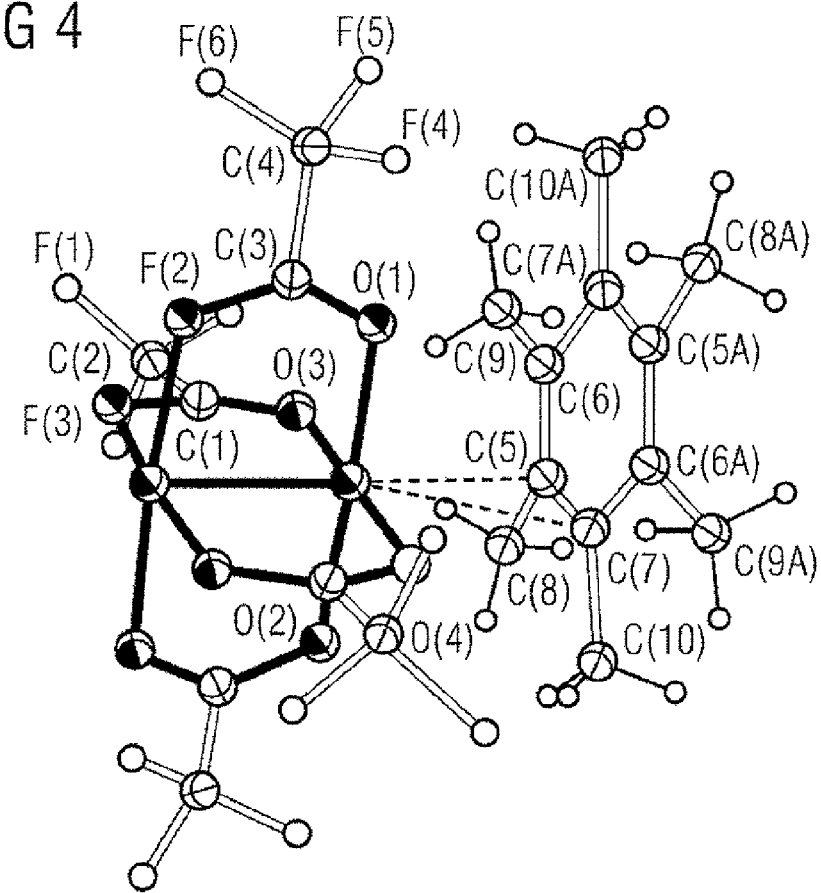
FIG. 4 shows the structure of $Rh_2 (CF_3COO)_4$.

FIG. 4 shows the structure of $Rh_2(CF_3COO)_4$, on which the aromatic system hexamethylbenzene is coordinated.

The metal complexes of this structure isoelectronic to $Rh_2^{4+}$ complexes, in particular those which are still of similar sizes to for example an analogue with $Ru_2^{2+}$ ions as central atoms, are likewise suitable as p-dopants. These bring about on the one hand the paddle wheel structure and on the other hand the very high Lewis acidity of these complexes. Particularly suitable are the central atoms or metal complexes suitable as p-dopants which may be coordinated directly on aromatic systems, such as for example uncharged aromatic systems. Metals which may therefore be considered in particular as central atoms are those of subgroups 6 to 9.

In a paddle-wheel complex at least two, usually exactly two metal central atoms, in particular transition metal atoms, are bridged by 1, 2, 3, 4 or more polydentate (in particular bidentate) ligands, which bind in each case one ligand atom to the at least two metal central atoms. The metal atoms are here usually coordinated, depending on radius, 4-fold with the stated ligand. The Lewis acid nature of the paddle-wheel complexes is produced in particular in that a loose or empty coordination site is present at least on one metal atom, onto which an aromatic ring, as shown in FIG. 4, may for example be attached. The coordination environment of the metal atom is preferably such that there is a metal-metal bond, as well as 4 equatorial bonds to ligands. As a rule, therefore, the axial position comprises the loose or empty coordination site, whereby, depending on ligand and central atom, the complex is Lewis acidic.

Suitable ligands are in particular any bi- or polydentate ligands, preferably electron-attracting ligands. Examples which may be mentioned are the anions of electron-attracting carboxylic acids, such as for example $CHal_xH_{3-x}COOH$, in particular $CF_xH_{3-x}COOH$ and $CCl_xH_{3-x}COOH$ (wherein x is an integer between 0 and 3 and Hal represents a halogen atom), $(CR_1,R_2,R_3)COOH$, wherein $R_1$, $R_2$ and $R_3$ may mutually independently be alkyl, such as particularly preferably H, methyl, ethyl, propyl, isopropyl, n-butyl, sec-butyl, tert-butyl, and benzoic acid and the substituted analogues thereof (o, p, m-fluorobenzoic acid, o,p,m-cyanobenzoic acid, nitrobenzoic acid, alkylbenzoic acids with fluorinated or partially fluorinated alkyl groups, optionally also mono- or polysubstituted pyridinecarboxylic acids etc.).

The metal complexes used according to the invention preferably constitute molecules which may be mutually independently vapour deposited. It goes without saying that individual metal complexes may in each case be attached to one another or to other components such as the matrix material.

In purely formal terms, the valence electrons of the PDW-2 could be calculated as follows:

In group IX with 4 uninegatively charged bidentate ligands, the following picture is obtained for metal-metal:
4×4e=16 electrons from the ligands
1×2e=2 from the single bond between Rh—Rh
2×9e=18 from rhodium
total 36, each Rh thus having a noble gas configuration, i.e. being stable.

Alternatively, the total 36 is obtained for other metals with the same ligands:
Group 6 metals: metal-metal quadruple bond, i.e. σ, 2×π, 1×δ bond occupied
Group 7 metals: metal-metal triple bond i.e. σ, 2×π, 1×δ bond, 1×δ* occupied
Group 8 metals: metal-metal double bond i.e. σ, 2×π, 1×δ bond, 1×δ*, 1×π* occupied
Group 9 metals: metal-metal single bond i.e. σ, 2×π, 1×δ bond, 1×δ*, 2×π* occupied It goes without saying that individual metal complexes may in each case be attached to one another or to other components such as the matrix material. The dopants are fixed in the matrix by donor/acceptor interaction bond formation and molecular size.

Suitable organic matrix materials are any common hole conductor matrices, such as for example NPS; NaphDATA; N,N'-bis(naphthalen-1-yl)-N,N'-bis(phenyl)-benzidine; N,N'-bis(naphthalen-2-yl)-N,N'-bis(phenyl)-benzidine; N,N'-bis(3-methylphenyl)-N,N'-bis(phenyl)-benzidine; N,N'-bis(3-methylphenyl)-N,N'-bis(phenyl)-9,9-spirobifluorene; N,N'-bis(naphthalen-1-yl)-N,N'-bis(phenyl)-9,9-spirobifluorene; N,N'-bis(3-methylphenyl)-N,N'-bis(phenyl)-9,9-dimethyl-fluorene; N,N'-bis(3-naphthalen-1-yl)-N,N'-bis(phenyl)-9,9-dimethyl-fluorene; N,N'-bis(3-methylphenyl)-N,N'-bis(phenyl)-9,9-diphenyl-fluorene; N,N'-bis(3-naphthalen-1-yl)-N,N'-bis(phenyl)-9,9-diphenyl-fluorene; 2,2',7,7'-tetrakis(N,N-diphenylamino)-9,9'-spirobifluorene; 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorene; 2,2',7,7'-tetrakis[(N-naphthalenyl(phenyl)-amino]-9,9-spirobifluorene; N,N'-bis(phenanthren-9-yl)-N,N'-bis(phenyl)-benzidine; 2,7-bis[N,N-bis(9,9-spiro-bifluorene-2-yl)-amino]-9,9-spirobifluorene; 2,2'-bis[N,N-bis(biphenyl-4-yl)amino]-9,9-spirobifluorene; 2,2'-bis(N,N-di-phenyl-amino)-9,9-spirobifluorene; phthalocyanine copper complex; 4,4',4''-tris(N-3-methylphenyl-N-phenyl-amino)triphenylamine; 4,4',4''-tris(N-(2-naphthyl)-N-phenyl-amino)triphenylamine; 4,4',4''-tris(N-(1-naphthyl)-N-phenyl-amino)triphenylamine; 4,4',4''-tris(N,N-diphenyl-amino)triphenylamine; titanium oxide phthalocyanine; 2,3,5,6-tetrafluoro-7,7,8,8,-tetra-cyano-quinodimethane; pyrazino[2,3-f][1,10]phenanthrolone-2,3-dicarbonitrile; N,N,N',N'-tetrakis(4-methoxyphenyl)-benzidine; 2,7-bis[N,N-bis(4-methoxy-phenyl)amino]-9,9-spirobifluorene; 2,2'-bis[N,N-bis(4-methoxy-phenyl)amino]-9,9-spirobifluorene; 1,3-bis(carbazol-9-yl)benzene; 1,3,5-tris(carbazol-9-yl)benzene; 4,4',4''-tris(carbazol-9-yl)triphenylamine; 4,4'-bis(carbazol-9-yl)biphenyl; 4,4'-bis(9-carbazolyl)-2,2'-dimethyl-biphenyl; 2,7-bis(carbazol-9-yl)-9,9-dimentylfluorene and 2,2',7,7'-tetrakis(carbazol-9-yl)-9,9'-spirobifluorene.

The current limiting discovered experimentally has not hitherto been observed for any of the published material systems suitable for doping. This aspect is particularly important for large-area organic light-emitting diodes, since it brings about luminance homogeneity. Field overshoots at particles or spikes in the substrate material are compensated by layers with current limiting, since the maximum current flow is no longer dependent on the field applied.

Figure 5:
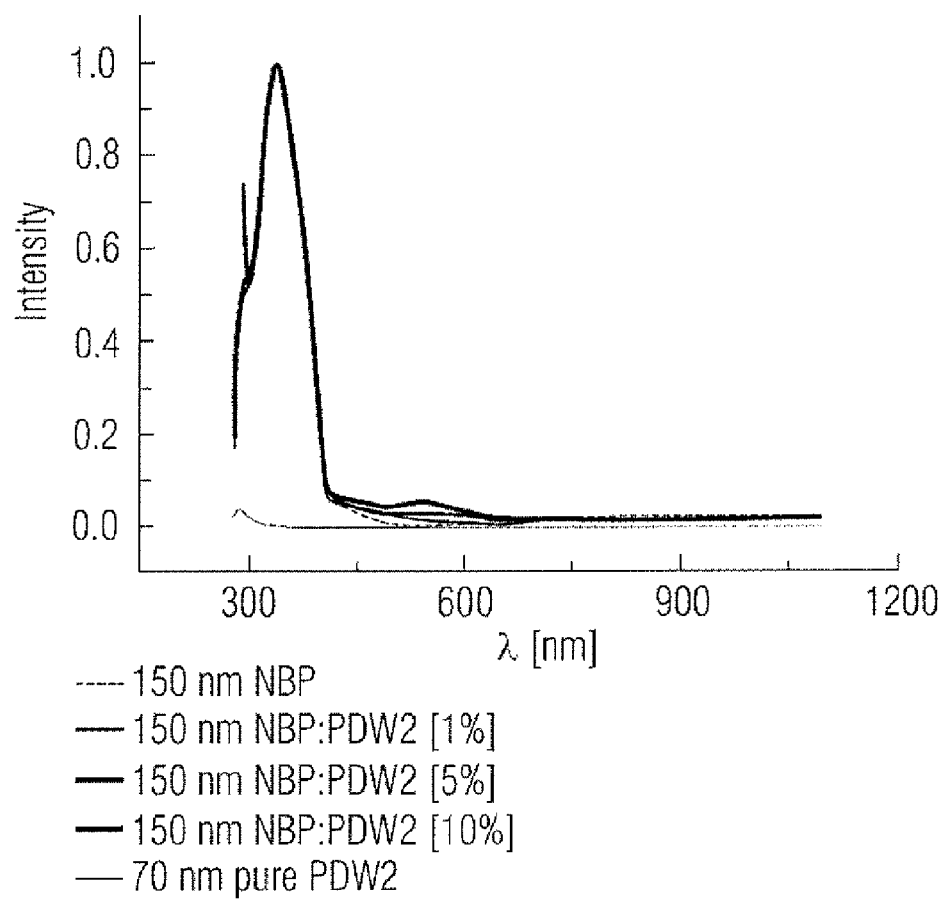
FIG. 5 shows characteristic curves obtained by doping NPB with PDW-2.
Figure 5:
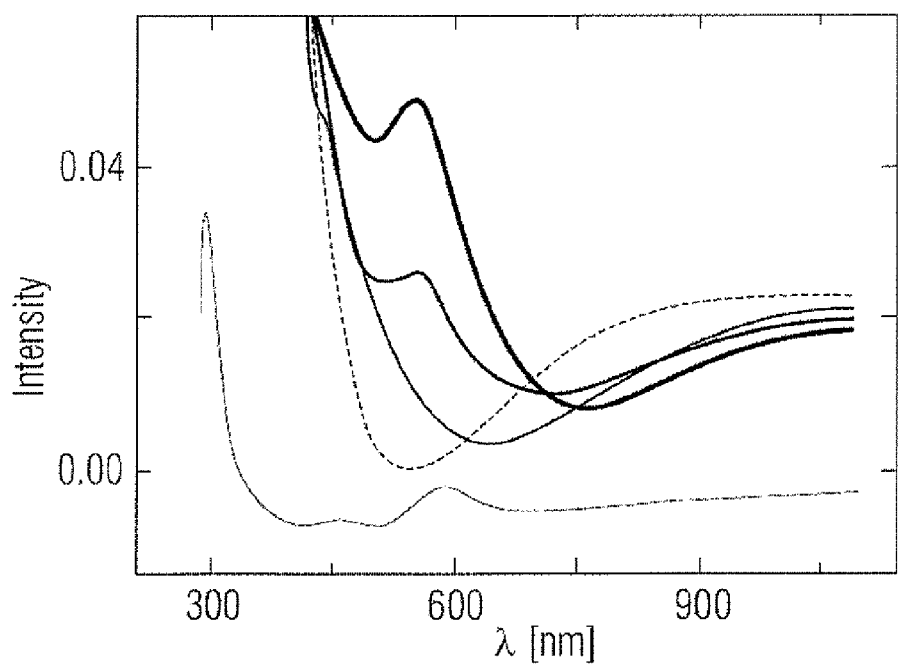

The invention is explained further with reference to a number of experimental results:

Example Relating to FIG. 5

As in the above-described experiment, PDW-2 is doped into the hole conductor NPB (=bis-N,N,N',N'-(naphthyl-phenyl)benzidine) by vapour co-deposition. The characteristic curves shown in FIG. 5 were obtained for 0%, 1%, 5% and 10% and 100% PDW2 doping.

An additional band in the UV spectrum in the range between 550-600 nm reveals the dopability of NPB by PDW-2.

Figure 6:
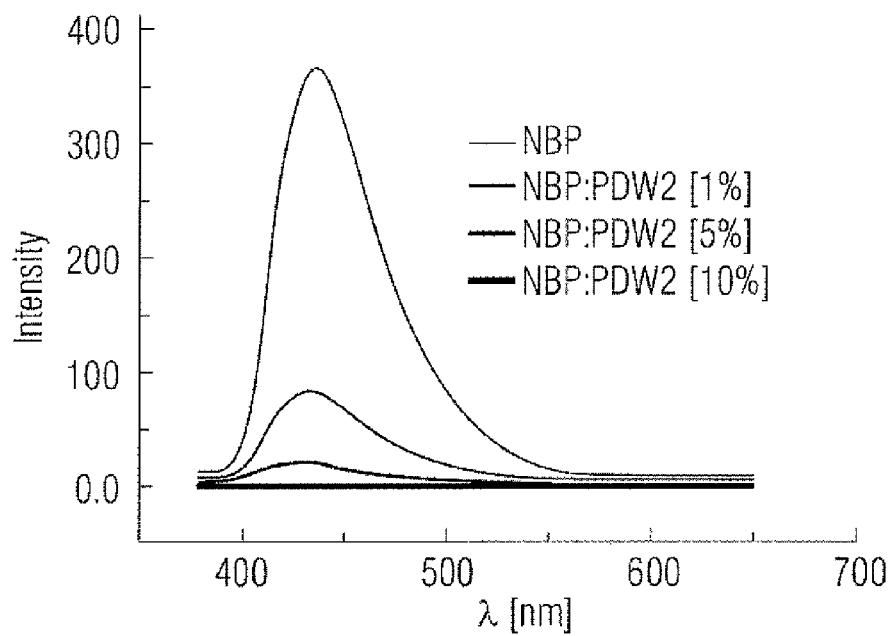
FIG. 6 shows the photoluminescence spectrum of the layers illustrated in the above-described Example relating to FIG. 5.

The graph of FIG. 6 shows the photoluminescence spectrum of the layers illustrated in the above-described Example relating to FIG. 5. When the layer is excited with 342 nm UV light, the fluorescence of the NPB layer decreases steadily. Exactly like other dopants, PDW-2 also suppresses fluorescence.

Figure 7:
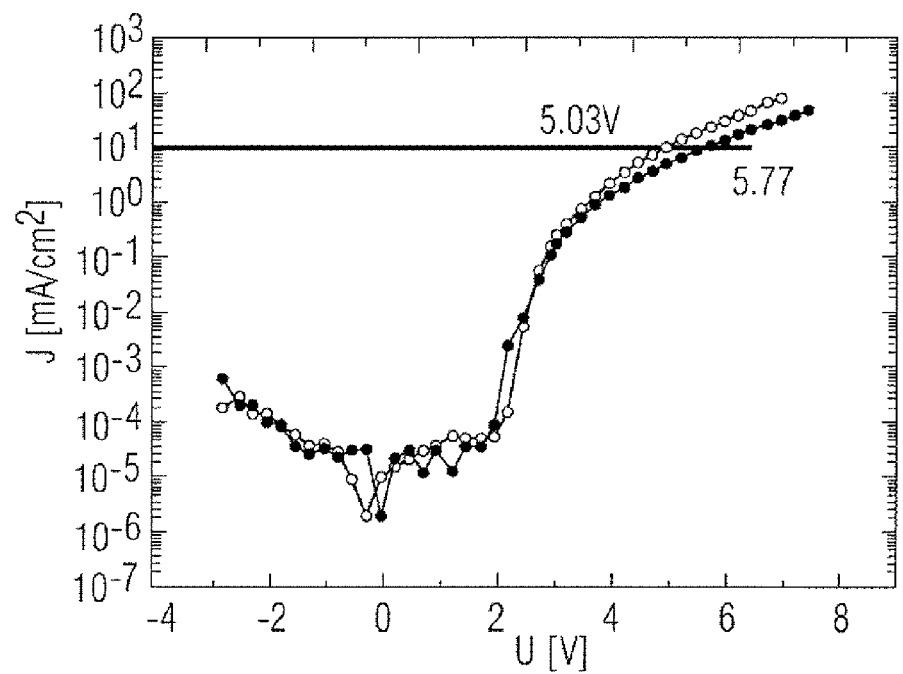
FIG. 7 shows an I-V characteristic curve of a diode in accordance with an embodiment of the invention.

Example Relating to FIG. 7

The following layers are thermally vapour-deposited in succession on an ITO (indium-tin oxide=indium-doped tin oxide) electrode, in order to construct an organic light-emitting diode (Alq=tris(hydroxyquinolinato) aluminium, LiF=lithium fluoride).

a. 50 nm NPB; 40 nm NPB; 40 nm Alq; 0.7 nm LiF; 200 nm Al (solid circles)
b. 50 nm NPB:PDW-2 [10%]; 40 nm NPB; 40 nm Alq; 0.7 nm LiF; 200 nm Al (blank circles)

By using the doped hole injection layer the voltage is reduced from 5.77 V to 5.03 V in the I-V characteristic curve, in order to achieve a current density of 10 mA/cm². The efficiency of this diode is markedly improved thereby, as is apparent from FIG. 7.

Figure 8:
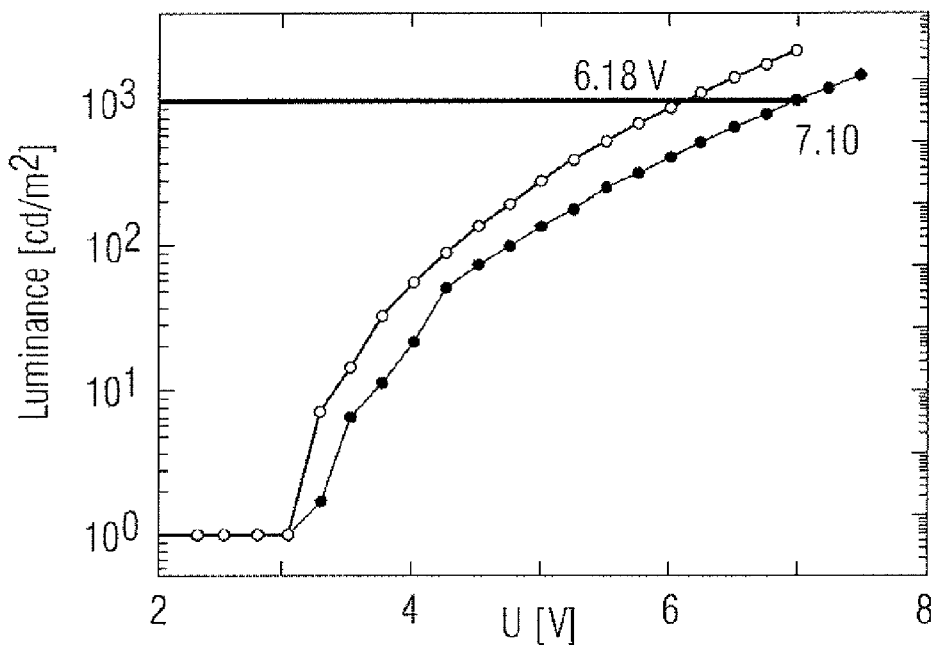
FIG. 8 shows a characteristic curve for an embodiment of the invention.

By reducing the supply voltage, a luminance of 1000 cd/m² is reached at just 6.18 V with the doped hole injection layer and only at 7.10V with the undoped hole injection layer (FIG. 8).

Figure 9:
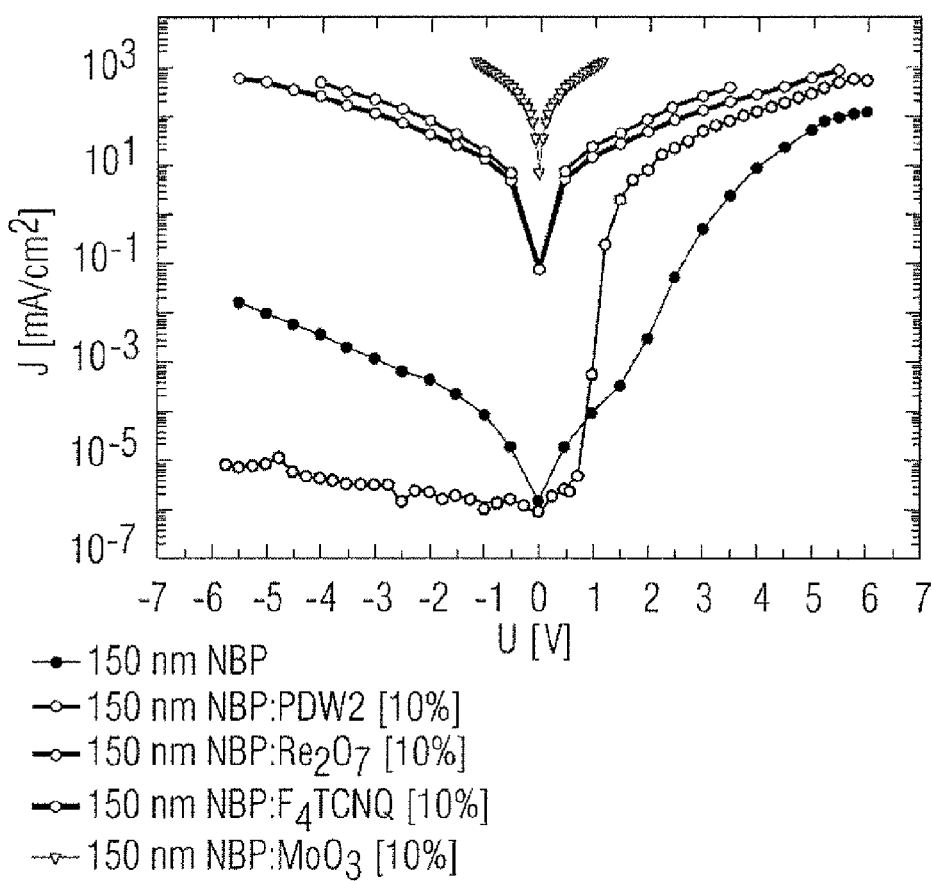
FIG. 9 shows characteristic curves obtained with various dopants.

Example Relating to FIG. 9:

In structures similar to the Example relating to FIG. 5, PDW-2 is of similar efficiency to other dopants known from the literature, for example $MoO_3$ or $F_4TCNQ$, as evidenced by the comparison shown here.

Figure 10:
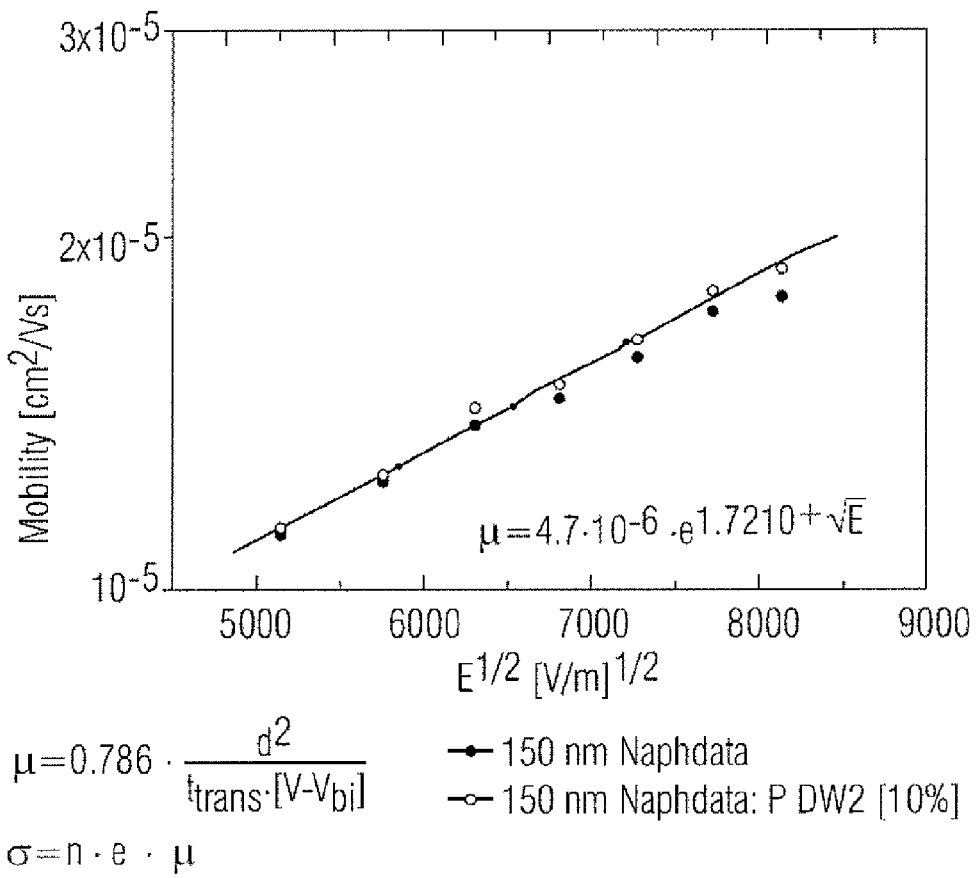
FIG. 10 shows a characteristic curve for mobility for an organic light emitting diode in accordance with an embodiment of the invention.

Example Relating to FIG. 10:

The charge carrier density may likewise be increased by the dopant PDW-2 in other hole conductors such as NaphDATA.

Transient dark current measurements show that, with 10% PDW-2 doping in NaphDATA, mobility remains virtually constant. As the Example relating to FIG. 10 demonstrates, the charge carrier density available for the organic light-emitting diode increases greatly, which has a very positive effect on the characteristic curves of organic light-emitting diodes. ($\sigma$=conductivity, $\mu$=mobility, n=number of charge carriers, e=elementary charge)

Figure 11:
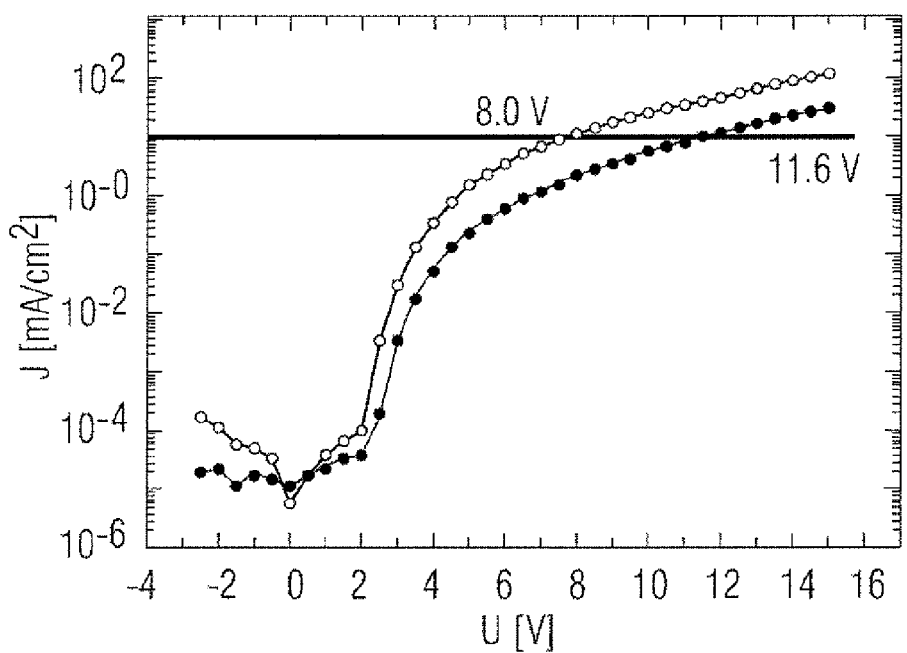
FIG. 11 shows a characteristic curve for a light-emitting diode of similar construction to the Example relating to FIG. 7 with NaphDATA instead of NPB in the hole injection layer.

Example Relating to FIG. 11:

A light-emitting diode of similar construction to the Example relating to FIG. 7 with NaphDATA instead of NPB in the hole injection layer.

a. 50 nm NaphDATA; 40 nm NPB; 40 nm Alq; 0.7 nm LiF; 200 nm Al (solid circles)
b. 50 nm NaphDATA:PDW-2 [10%]; 40 nm NPB; 40 nm Alq; 0.7 nm LiF; 200 nm Al (blank circles)

By using the doped hole injection layer the voltage is reduced from 11.6 V to 8.0 V in the I-V characteristic curve, in order to achieve a current density of 10 mA/cm². The efficiency of this diode is markedly improved thereby (FIG. 11).

Figure 12:
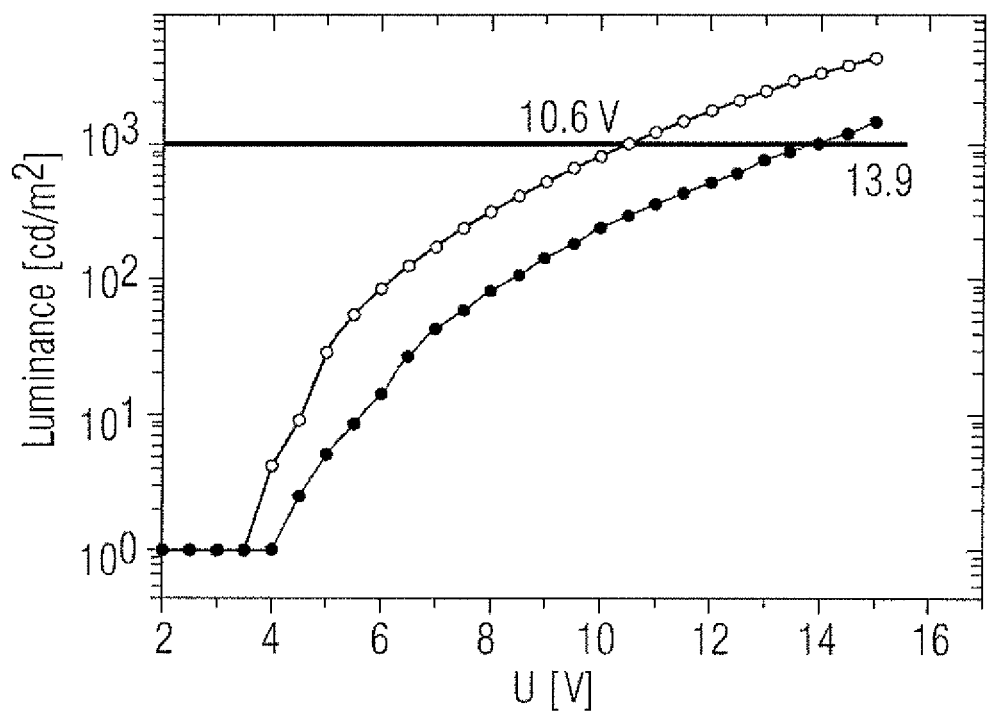
FIG. 12 shows a characteristic curve for an embodiment of the invention.

Example Relating to FIG. 12:

By reducing the supply voltage, a luminance of 1000 cd/m² is reached at just 10.6 V with the doped hole injection layer and only at 13.9V with the undoped hole injection layer (FIG. 12).

The experimentally identified current limiting has not hitherto been observed for any of the published material systems suitable for doping. This aspect is particularly important for large-area organic light-emitting diodes, since it brings about luminance homogeneity. Field overshoots at particles or spikes in the substrate material are compensated by layers with current limiting, since the maximum current flow is no longer dependent on the field applied.

The invention is distinguished in particular in that the materials used are OLED compatible and in that, for example in the preferred binuclear metal complexes with a metal-metal bond, in formal terms the charge is distributed between two metal atoms per molecule during current transport, which contributes to the stability of the overall layer.

The invention relates to the use of a metal complex as p-dopant for an organic semiconducting matrix material, to an organic semiconductor material and to an organic light-emitting diode. In this respect, the invention discloses the use of metal complexes, which function as Lewis acids, as p-dopants in organic matrix materials.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for doping said hole-conducting organic matrix material of a radiation-emitting device a hole-conducting organic matrix material of a radiation-emitting device, comprising the steps of doping with a metal complex as p-dopant, wherein the metal complex is a metal complex with Lewis acid properties and acts as an electron pair acceptor, wherein the metal complex comprises at least one ligand selected from carboxylic acids or carboxylic anions with electron-attracting substituents.

2. The method according to claim 1, wherein the metal complex is a polynuclear metal complex.

3. The method according to claim 1, wherein a central atom of the metal complex is a neutral or charged transition metal atom.

4. The method according to claim 1, wherein at least one central atom is selected from the subgroups 6 to 9.

5. The method according to the preceding claim 4, wherein said at least one central atom is rhodium.

6. The method according to claim 1, wherein the metal complex is a polynuclear metal complex, in which at least one ligand coordinatively links two central atoms.

7. The method according to claim 1, wherein at least one central atom is planar-quadratically surrounded by ligands.

8. The method according to claim 1, wherein the metal complex is of a polynuclear and symmetrical structure.

9. The method according to claim 1, wherein at least one metal complex has a paddle-wheel structure.

10. An organic semiconducting material in a radiation emitting device, containing at least one organic matrix material and a p-dopant according to claim 1.

11. The organic semiconducting material according to claim 10, wherein the molar doping ratio of p-dopant to monomeric units of a polymeric matrix molecule amounts to between 1:1 and 1:100,000.

12. A method of producing an organic semiconducting material containing an organic matrix material in a radiation-emitting device, and a p-dopant, wherein at least one or more metal complexes according to claim 1 are the p-dopant.

13. A radiation-emitting device containing an organic semiconducting material according to claim 10.

14. The radiation-emitting device according to claim 13, wherein the radiation-emitting device is an organic light-emitting diode, which comprises two electrodes, a hole-conducting layer and an emitting layer, wherein the hole-conducting layer contains one or more metal complexes with Lewis acid properties.

15. The method according to claim 4, wherein at least one central atom is ruthenium.

16. The method according to claim 1, wherein the electron-attracting substituents are halogen atoms.

* * * * *

UNITED STATES PATENT AND TRADEMARK OFFICE
CERTIFICATE OF CORRECTION

PATENT NO. : 8,513,702 B2
APPLICATION NO. : 12/665934
DATED : August 20, 2013
INVENTOR(S) : Schmid et al.

It is certified that error appears in the above-identified patent and that said Letters Patent is hereby corrected as shown below:

In the Claims

Amend claims 1 and 12 as follows:

Col. 8, lines 11-19

1. A method for doping ~~said hole-conducting organic matrix material of a radiation-emitting device~~ a hole-conducting organic matrix material of a radiation-emitting device, comprising the steps of doping <u>said hole-conducting organic matrix material of a radiation-emitting device</u> with a metal complex as p-dopant, wherein the metal complex is a metal complex with Lewis acid properties and acts as an electron pair acceptor, wherein the metal complex comprises at least one ligand selected from carboxylic acids or carboxylic anions with electron-attracting substituents.

Col. 8, lines 45-48

12. A method of producing an organic semiconducting material ~~containing an organic matrix material~~ in a radiation-emitting device <u>containing an organic matrix material</u>, and a p-dopant, wherein at least one or more metal complexes according to claim 1 are the p-dopant.

Signed and Sealed this
Twenty-second Day of April, 2014

Michelle K. Lee
*Deputy Director of the United States Patent and Trademark Office*